(12) United States Patent
Scott

(10) Patent No.: US 7,372,249 B2
(45) Date of Patent: May 13, 2008

(54) LOAD MEASUREMENT FOR A THERMAL MICROWAVE POWER SENSOR

(75) Inventor: Jonathan B Scott, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 147 days.

(21) Appl. No.: 11/344,627

(22) Filed: Jan. 31, 2006

(65) Prior Publication Data

US 2007/0176624 A1    Aug. 2, 2007

(51) Int. Cl.
*G01R 31/00* (2006.01)
(52) U.S. Cl. ............................ 324/95; 324/96; 324/105
(58) Field of Classification Search ...................... None
See application file for complete search history.

(56) References Cited

U.S. PATENT DOCUMENTS

| 4,789,823 | A | 12/1988 | Delfs et al. |
| 5,705,962 | A * | 1/1998 | Fleeger et al. ............... 333/136 |
| 6,518,743 | B1 | 2/2003 | Kodato |

OTHER PUBLICATIONS

Jackson, Weldon H., "A Thin-Film/Semiconductor Thermocouple for Microwave Power Measurements", Hewlett Packard Journal, vol. 26, No. 1, Sep. 1974.

* cited by examiner

*Primary Examiner*—Minh N. Tang
(74) *Attorney, Agent, or Firm*—Pamela Lau Kee

(57) ABSTRACT

A thermocouple power sensor includes the ability to monitor the value of a RF load resistor. A meter connects to the input of a thermocouple-based RF signal power detector. The apparatus can sense its own load resistor DC impedance, so it can detect both aging in and damage sustained through overload to the RF dissipation element.

3 Claims, 2 Drawing Sheets

LOAD MEASUREMENT FOR A THERMAL MICROWAVE POWER SENSOR

BACKGROUND

A thermocouple microwave power sensor detects the power of a wide-band RF signal. Thin Film and Monolithic thermocouples have been used for power measurements. Thermocouple microwave power sensors suffer from a susceptibility to burn out at higher power levels, parasitic reactances that limit their frequency range, and nonlinear thermocouple response. Typical thermocouple power sensors (shown schematically in FIGS. 1A and 1B) are disclosed by Jackson in Hewlett Packard Journal, September 1974, Vol. 26, No.1, "A Thin-Film/Semiconductor Thermocouple for Microwave Power Measurements", by Kodato in U.S. Pat. No. 6,518,743, "Wide-band RF signal power detecting element and power detecting device using the same", and by Delfs, et al. in U.S. Pat. No. 4,789,823, "Power sensor for RF power measurements".

As shown in FIG. 1A, Jackson uses capacitors to separate the incoming RF (AC) and outgoing measurable (DC) signals. As shown in FIG. 1B, the power dissipating resistor is isolated from the thermocouples, and a capacitor to block incoming DC is optional (not shown). Linearity correction is included in the controls of the power sensor as the accuracy degrades towards the high end of the meter.

In operation, one or more thermocouple pairs measure the temperature difference between two points. The temperature rise is assumed to be proportional to the unknown input power.

In some power sensors, a symmetrical arrangement of power dissipating elements and temperature sensors is used. In this "calorimetric" method, the DC power applied to one of the identical halves of the sensor arrangement is adjusted to match the unknown power applied to the other of the two identical halves of the sensor arrangement. When each of the two temperature sensors reads the same temperature, the known DC power applied is equal to the unknown RF power. A meter employing this method is disclosed by N. R. Erickson in "A fast and sensitive submillimeter waveguide power meter," in Tenth Int. Space Terahertz Technol. Symp., Charlottesville, Va., March 1999, pp. 501-507.

SUMMARY

A meter connects to the input of a thermocouple-based RF signal power detector. The apparatus can sense its own load resistor DC impedance, so it can detect both aging in and damage sustained through overload to the RF dissipation element.

Further features and advantages of the present invention, as well as the structure and operation of preferred embodiments of the present invention, are described in detail below with reference to the accompanying exemplary drawings.

DETAILED DESCRIPTION

The present invention is a thermocouple power sensor that includes the ability to monitor the value of the RF load resistor.

Figure 1A:
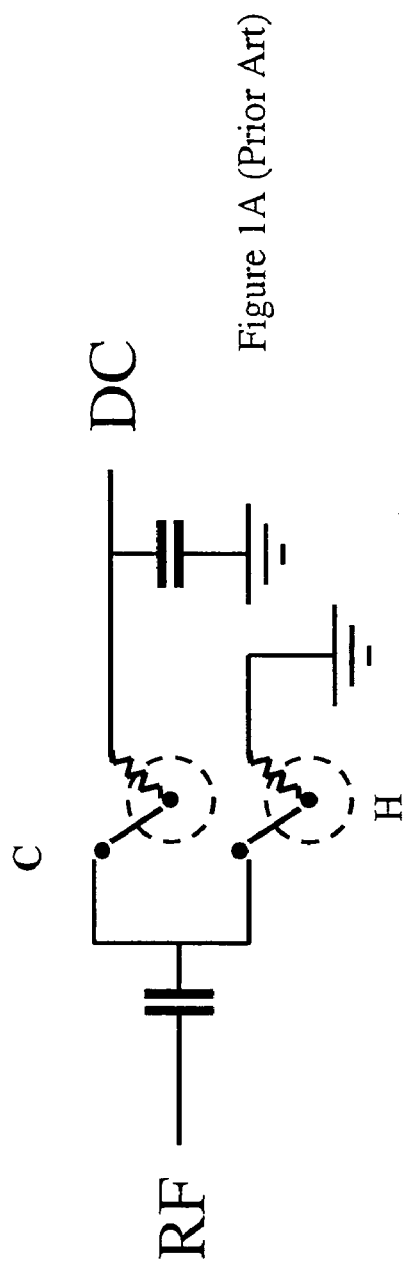
FIGS. 1A and 1B illustrate prior art power sensors.
Figure 1B:
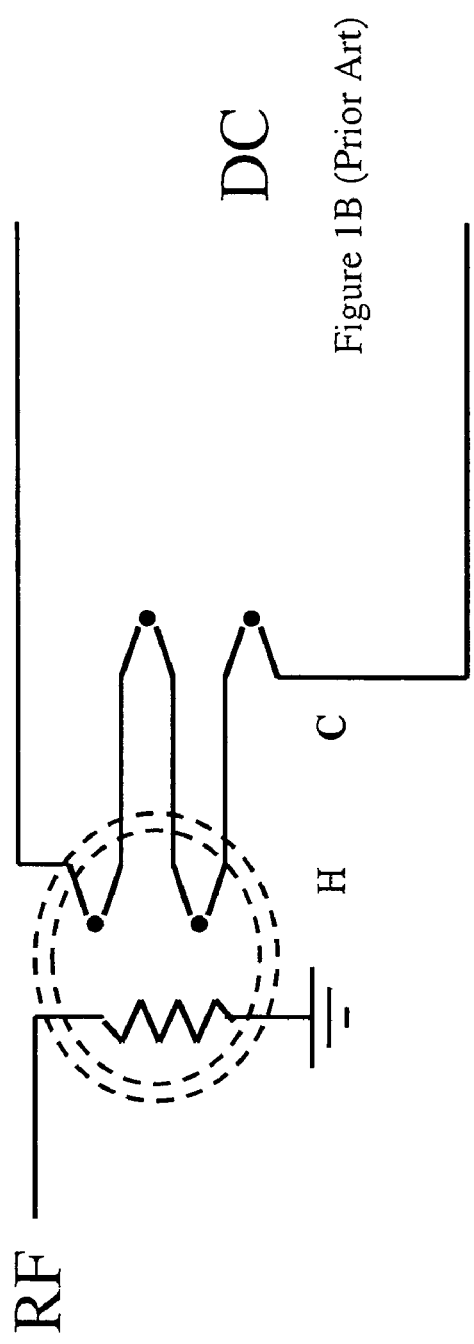
Figure 2A:
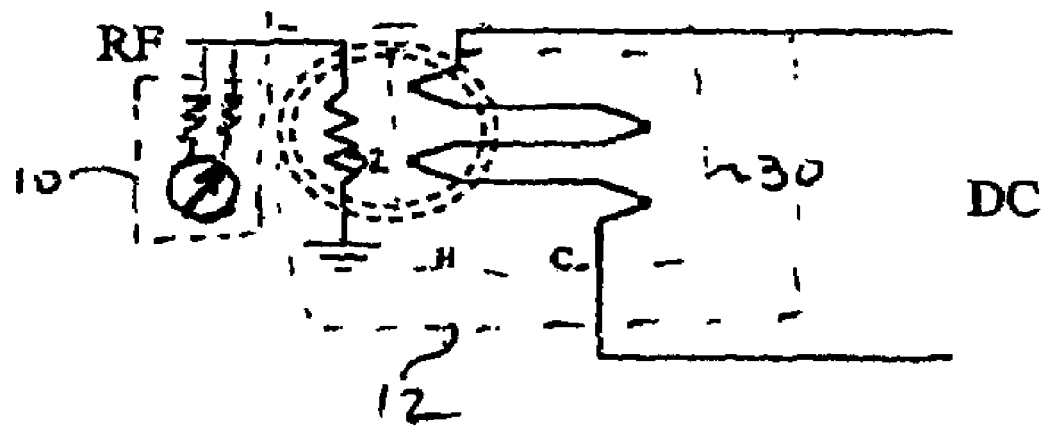
FIG. 2A-2B illustrate embodiments of the present invention.
Figure 2B:
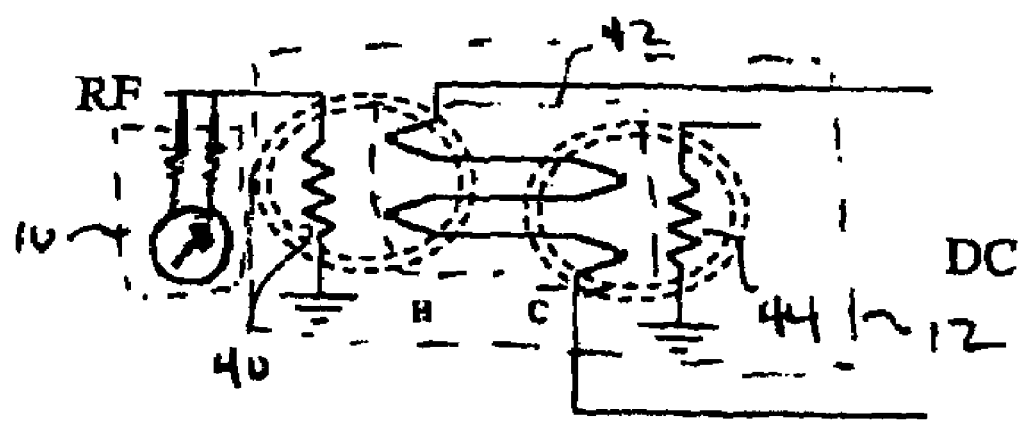

FIGS. 2A-B illustrate embodiments of the present invention. A meter 10 is connected to the RF input of an RF signal power detector 12 that includes a basic thermocouple-based power sensor. The apparatus can sense its own load resistor DC impedance, so it can detect both aging in and damage sustained through overload to the RF dissipation element.

The meter that monitors the load resistance is of the Kelvin type. It applies a current to the RF load resistance through a high-value resistor, and senses the voltage dropped across the load through a second high-value resistor. The high-value resistors have values many times larger than that of the RF load resistor and thus do not significantly alter the sensor Standing Wave Ratio (SWR).

In each illustrative example, a RF signal power detector 12 includes one or more thermocouple units, forming a "thermopile", and coupled on a unitary substrate. Each thermocouple unit consists of a pair of thermocouples in series, one nominally "hot" and the other nominally "cold".

In FIG. 2A, one resistor 30 is electrically isolated from the thermopile 32. The resistor 30 is positioned adjacent to the "hot" junctions of the thermopile 32.

In FIG. 2B, two resistors are electrically isolated from the thermopile. One resistor 40 is positioned adjacent to the "hot" junctions of the thermopile 42, and the other resistor 44 is positioned adjacent to the "cold" junctions of the thermopile 42, in a symmetrical manner.

The power sensor can provide feedback to the user when it may be giving the wrong answer. This provides a calibration schedule based on potential failure as opposed to hours of service.

Although the present invention has been described in detail with reference to particular embodiments, persons possessing ordinary skill in the art to which this invention pertains will appreciate that various modifications and enhancements may be made without departing from the spirit and scope of the claims that follow.

I claim:

1. A RF signal power detector comprising:
   a Kelvin type meter; and
   a RF power detector including thermocouples, having a RF input, having a thermopile including at least one pair of thermocouples in series, wherein each pair includes one "HOT" and one "COLD" junction:
   a first and a second resistors electrically isolated from the thermopile, the first resistor positioned adjacent to the "HOT" junction and the second resistor positioned adjacent to the "COLD" junction, wherein the resistors are positioned symmetrically;
   wherein the meter connects to the input of the RF power detector.

2. A RF signal power detector, as in claims 1, wherein the thermocouples of the thermopile are integrated into a unitary substrate.

3. A RF signal power detector, as in claim 2, wherein the substrate and thermocouples include semiconductors.

* * * * *

UNITED STATES PATENT AND TRADEMARK OFFICE
CERTIFICATE OF CORRECTION

PATENT NO. : 7,372,249 B2 Page 1 of 1
APPLICATION NO. : 11/344627
DATED : May 13, 2008
INVENTOR(S) : Scott It is certified that error appears in the above-identified patent and that said Letters Patent is hereby corrected as shown below:

In column 2, line 48, in Claim 1, delete "junction:" and insert -- junction; --, therefor.

In column 2, line 56, in Claim 2, delete "claims" and insert -- claim --, therefor.

Signed and Sealed this

Second Day of September, 2008

JON W. DUDAS
*Director of the United States Patent and Trademark Office*